(12) United States Patent
Peng (10) Patent No.: US 12,181,692 B2
(45) Date of Patent: Dec. 31, 2024

(54) LIGHT ADJUSTMENT MODULE

(71) Applicant: Coretronic Corporation, Hsin-Chu (TW)

(72) Inventor: Ken-Teng Peng, Hsin-Chu (TW)

(73) Assignee: Coretronic Corporation, Hsin-Chu (TW)

( * ) Notice: Subject to any disclaimer, the term of this patent is extended or adjusted under 35 U.S.C. 154(b) by 0 days.

(21) Appl. No.: 18/398,149

(22) Filed: Dec. 28, 2023

(65) Prior Publication Data

US 2024/0219611 A1 Jul. 4, 2024

(30) Foreign Application Priority Data

Jan. 3, 2023 (CN) .......................... 202310002663.6

(51) Int. Cl.
*G02B 5/02* (2006.01)
*F21S 10/00* (2006.01)
(Continued)

(52) U.S. Cl.
CPC .............. *G02B 5/0278* (2013.01); *F21V 9/45* (2018.02); *F21V 14/006* (2013.01); *F21V 21/34* (2013.01);
(Continued)

(58) Field of Classification Search
CPC .... G02B 5/021; G02B 5/0215; G02B 5/0221; G02B 5/0231; G02B 26/02; G02B 5/02;
(Continued)

(56) References Cited

U.S. PATENT DOCUMENTS

2005/0018423 A1* 1/2005 Warnecke ................. F21V 9/40
362/230
2005/0254254 A1* 11/2005 Moseler ................. F21S 41/275
362/520
(Continued)

FOREIGN PATENT DOCUMENTS

CN           202629784        12/2012
CN           108980782 A  *  12/2018   ............. F21V 14/06
(Continued)

OTHER PUBLICATIONS

Machine translation of CN-108980782-A retrieved from the FIT database of PE2E search. (Year: 2024).*

*Primary Examiner* — Colin J Cattanach
(74) *Attorney, Agent, or Firm* — JCIPRNET (57) ABSTRACT

A light adjustment module is suitable for being disposed on a transmission path of a light beam. The light adjustment module comprises a housing, a moveable plate, a diffuser, and a light sensor. The housing comprises a base and a cover connected to each other. The cover has a light entrance. The moveable plate is disposed between the base and the cover. The moveable plate moves relative to the housing along a moving direction. The diffuser is disposed on the moveable plate and the transmission path of the light beam from the light entrance. The light sensor is disposed on the base to sense the light beam from the diffuser. The diffuser has at least two regions arranged in the moving direction. The at least two regions respectively have different optical properties. The light beam has different brightness after respectively passing through the at least two regions.

8 Claims, 7 Drawing Sheets

(51) Int. Cl.
*F21V 5/02* (2006.01)
*F21V 9/40* (2018.01)
*F21V 9/45* (2018.01)
*F21V 11/08* (2006.01)
*F21V 11/12* (2006.01)
*F21V 14/00* (2018.01)
*F21V 14/06* (2006.01)
*F21V 14/08* (2006.01)
*F21V 21/34* (2006.01)
*F21W 131/406* (2006.01)
*G02B 26/02* (2006.01)
*G02B 26/04* (2006.01)
*G03F 7/00* (2006.01)

(52) U.S. Cl.
CPC ............. *G02B 5/021* (2013.01); *F21S 10/007* (2013.01); *F21V 5/02* (2013.01); *F21V 9/40* (2018.02); *F21V 11/08* (2013.01); *F21V 11/12* (2013.01); *F21V 14/06* (2013.01); *F21V 14/065* (2013.01); *F21V 14/08* (2013.01); *F21V 14/085* (2013.01); *F21W 2131/406* (2013.01); *G02B 5/0215* (2013.01); *G02B 5/0221* (2013.01); *G02B 5/0231* (2013.01); *G02B 26/02* (2013.01); *G02B 26/04* (2013.01); *G03F 7/70075* (2013.01)

(58) Field of Classification Search
CPC ....... G02B 10/007; G02B 26/04; F21V 11/08; F21V 11/12; F21V 14/06; F21V 14/065; F21V 14/08; F21V 9/40; F21V 14/085; F21V 2131/406; F21V 21/34; G03F 7/70075

See application file for complete search history.

(56) References Cited

U.S. PATENT DOCUMENTS

| | | | | |
|---|---|---|---|---|
| 2008/0137197 | A1* | 6/2008 | Hsu | G02B 5/0215 359/599 |
| 2009/0073696 | A1* | 3/2009 | Melzner | F21V 9/40 362/279 |
| 2009/0086475 | A1* | 4/2009 | Caruso | F21K 9/65 362/231 |
| 2012/0140463 | A1* | 6/2012 | Kinzer | F21V 7/043 362/231 |
| 2012/0236535 | A1* | 9/2012 | Parker | F21V 13/08 362/293 |
| 2015/0219315 | A1* | 8/2015 | Park | G02B 26/007 362/277 |
| 2017/0269292 | A1* | 9/2017 | Jurik | F21V 14/04 |
| 2018/0180268 | A1* | 6/2018 | Jurik | G02B 19/0066 |
| 2020/0236759 | A1* | 7/2020 | Jurik | F21V 29/51 |
| 2022/0373163 | A1* | 11/2022 | Fujita | G02B 6/0076 |

FOREIGN PATENT DOCUMENTS

| | | |
|---|---|---|
| TW | 200303428 | 9/2003 |
| TW | 201250781 | 12/2012 |

* cited by examiner

LIGHT ADJUSTMENT MODULE

CROSS-REFERENCE TO RELATED APPLICATION

This application claims the priority benefit of China application serial no. 202310002663.6, filed on Jan. 3, 2023. The entirety of the above-mentioned patent application is hereby incorporated by reference herein and made a part of this specification.

BACKGROUND

Technical Field

The disclosure relates to an adjustment module, and in particular relates to a light adjustment module.

Description of Related Art

In the current market of electronic devices (e.g., projectors), the requirement for the brightness of the light beam is increasingly stricter, and a light adjustment module is usually disposed on the transmission path of the light beam to sense and adjust the brightness of the light beam. Generally speaking, the way for the light adjustment module to adjust the incident light quantity of the light beam is, for example, to movably adjust the size of the light entrance through the structural design of the housing.

However, due to the small size of the currently commercially available light sensors, when the size of the structural design of the housing deviates, or the size of the light entrance of the housing is improperly controlled, the light beam sensed by the light sensor is prone to over exposure, and the relationship between the size of the light entrance and the corresponding light beam brightness is not linear. As a result, the light adjustment module is not easy to control, and is prone to abnormalities which increases the maintenance hours. Moreover, in order to improve the above-mentioned over exposure issue, multiple diffusers are stacked on the transmission path of the light beam to assist in light control. However, the number of diffusers increases significantly due to the increase in the brightness of the beam, thereby increasing the cost of parts and assembly hours.

The information disclosed in this Background section is only for enhancement of understanding of the background of the described technology and therefore it may contain information that does not form the prior art that is already known to a person of ordinary skill in the art. Further, the information disclosed in the Background section does not mean that one or more problems to be resolved by one or more embodiments of the disclosure was acknowledged by a person of ordinary skill in the art.

SUMMARY

A light adjustment module of the present disclosure is suitable for being disposed on a transmission path of a light beam, and includes a housing, a moveable plate, a diffuser, and a light sensor. The housing includes a base and a cover connected to each other. The cover has a light entrance. The moveable plate is disposed between the base and the cover. The moveable plate moves relative to the housing along a moving direction. The diffuser is disposed on the moveable plate. The diffuser is disposed on the transmission path of the light beam from the light entrance. The light sensor is disposed on the base to sense the light beam from the diffuser. The diffuser has at least two regions arranged in the moving direction. The at least two regions respectively have different optical properties. The light beam has different brightness after respectively passing through the at least two regions.

Other objectives, features and advantages of the present disclosure will be further understood from the further technological features disclosed by the embodiments of the present disclosure wherein there are shown and described preferred embodiments of this disclosure, simply by way of illustration of modes best suited to carry out the disclosure.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION OF DISCLOSED EMBODIMENTS

In the following detailed description of the preferred embodiments, reference is made to the accompanying drawings which form a part hereof, and in which are shown by way of illustration specific embodiments in which the disclosure may be practiced. In this regard, directional terminology, such as "top," "bottom," "front," "back," etc., is used with reference to the orientation of the Figure(s) being described. The components of the present disclosure may be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present disclosure. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing,"

"faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

The disclosure provides a light adjustment module with good light adjustment ability.

The other objectives and advantages of the present disclosure may be further understood from the descriptive features disclosed in the present disclosure.

Figure 1:
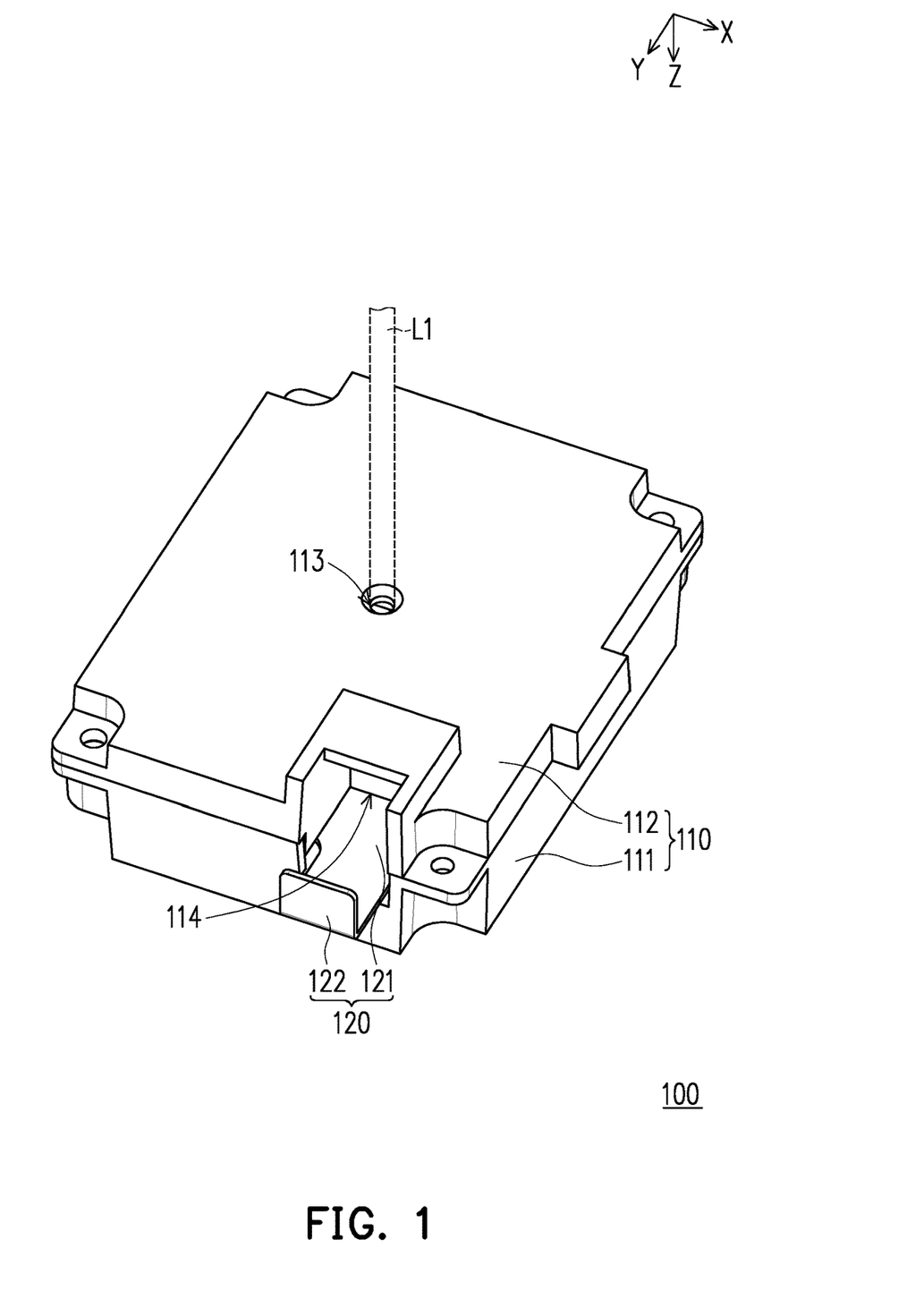
FIG. 1 is a three-dimensional schematic diagram of a light adjustment module according to an embodiment of the present disclosure.
Figure 2:
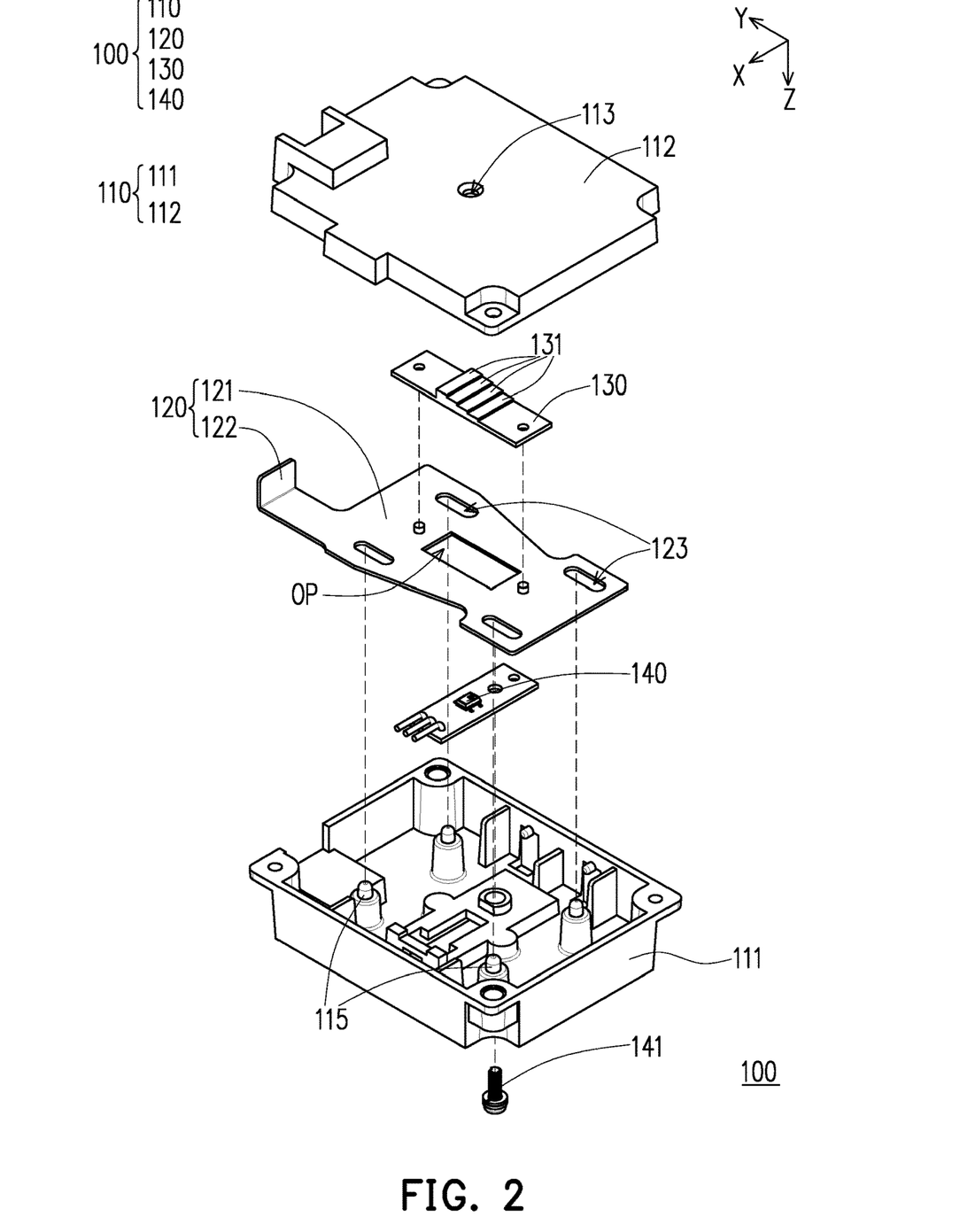
FIG. 2 is an exploded schematic diagram of the light adjustment module in FIG. 1.
Figure 3:
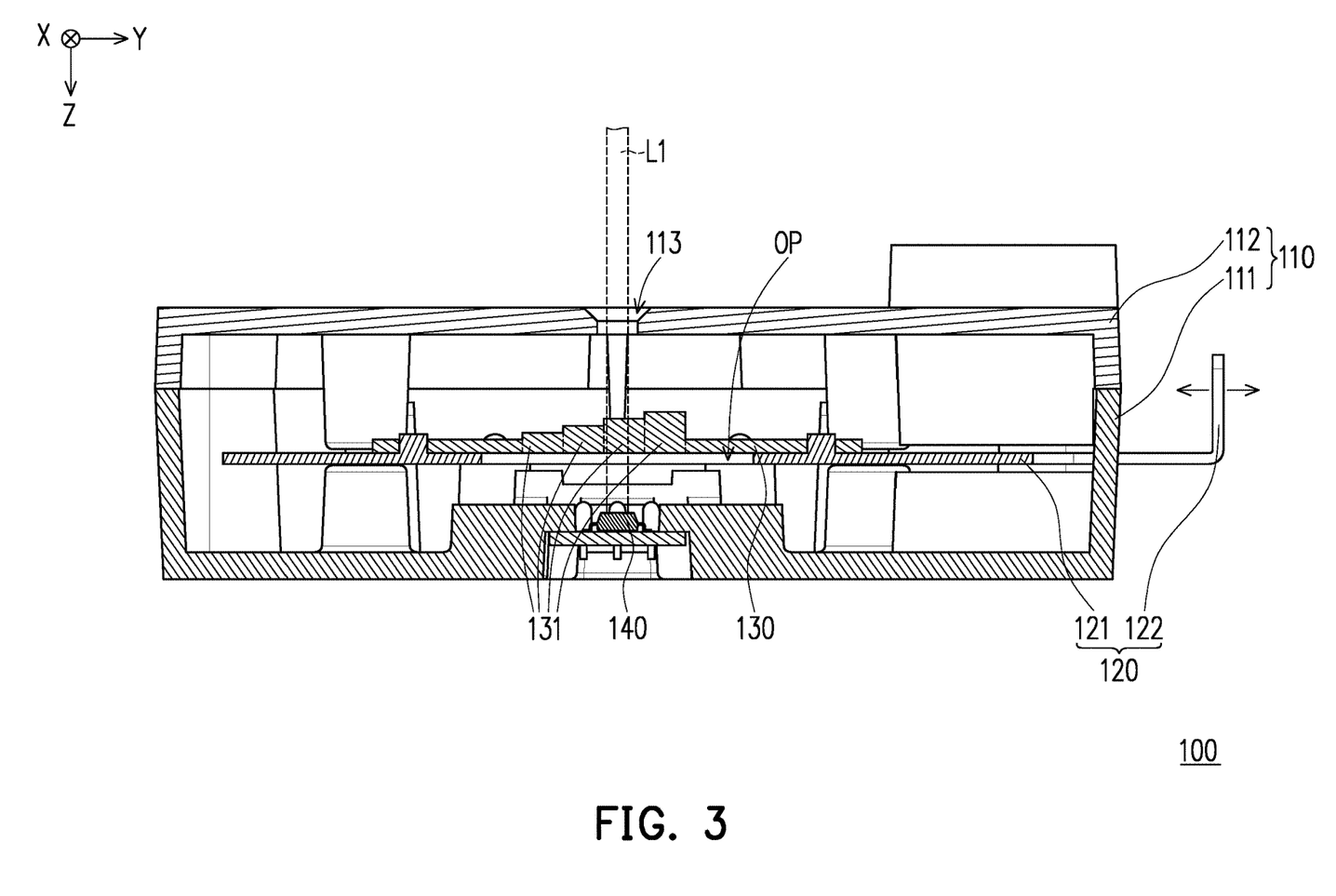
FIG. 3 is a cross-sectional schematic diagram of the light adjustment module in FIG. 1.
Figure 4:
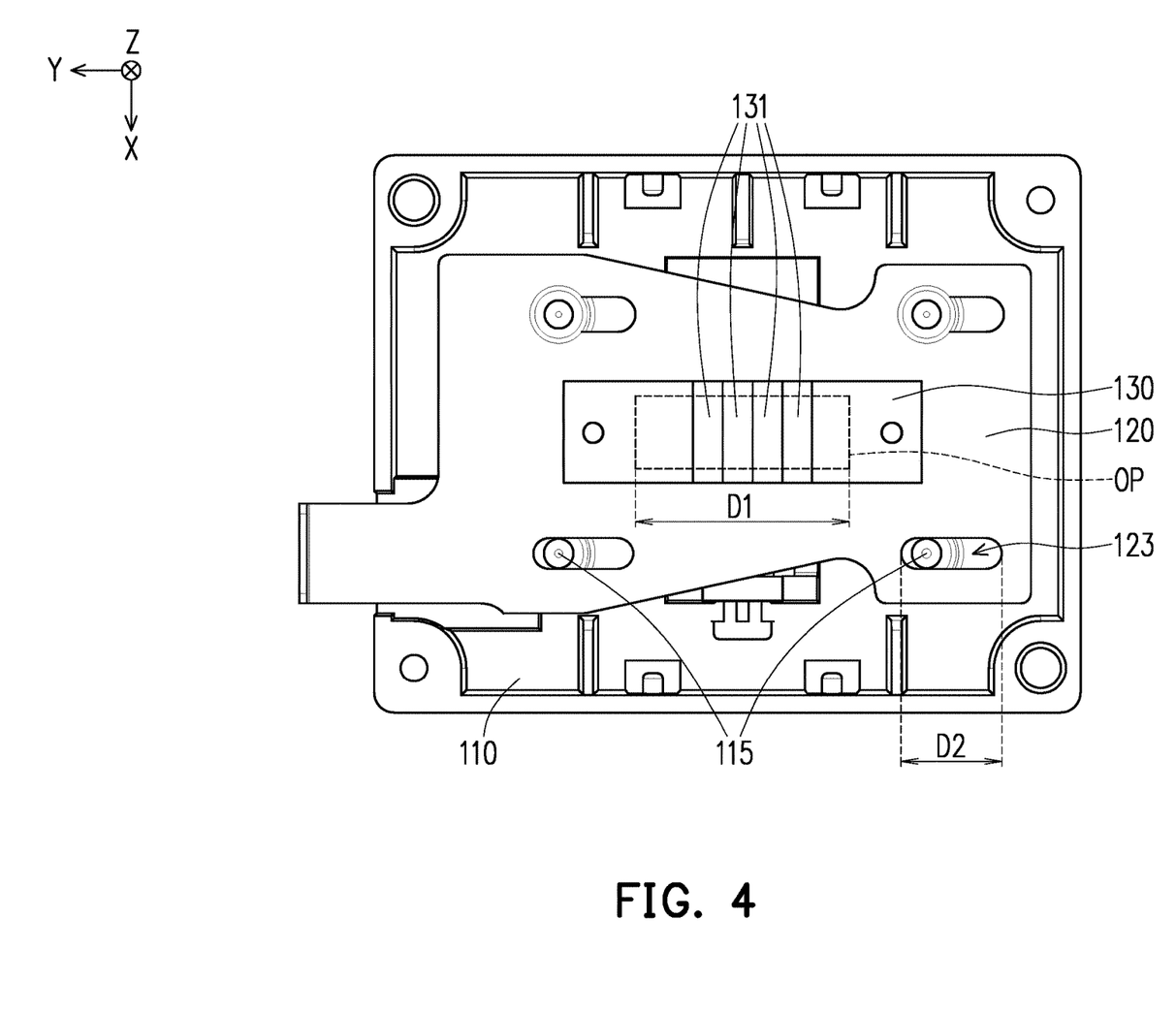
FIG. 4 is a top schematic diagram of some components of the light adjustment module of FIG. 1.

FIG. 1 is a three-dimensional schematic diagram of a light adjustment module according to an embodiment of the present disclosure. FIG. 2 is an exploded schematic diagram of the light adjustment module in FIG. 1. FIG. 3 is a cross-sectional schematic diagram of the light adjustment module in FIG. 1. FIG. 4 is a top schematic diagram of some components of the light adjustment module of FIG. 1. It should be noted that the Cartesian coordinates XYZ are also provided to facilitate the related description and reference of subsequent components. Moreover, in order to clearly illustrate the internal components of the light adjustment module 100, the cover 112 is omitted in FIG. 4.

Referring to FIG. 1, the light adjustment module 100 of this embodiment is suitable to be disposed on the transmission path of the light beam L1. For example, the light beam L1 is provided by a light source (not shown), and the light source (not shown) includes at least one light-emitting element, in which the light-emitting element is formed by a single or multiple light-emitting diodes (LED) or laser diodes (LD). However, the present disclosure does not limit the type or form of the light source, and its detailed structure and implementation may be obtained from sufficient teaching, suggestion, and implementation description based on common knowledge in the art, so details are not repeated herein.

Specifically, referring to FIG. 2 and FIG. 3, in this embodiment, the light adjustment module 100 includes a housing 110, a moveable plate 120, a diffuser 130, and a light sensor 140. The housing 110 includes a base 111 and a cover 112 connected along the Z-axis direction, and the cover 112 has a light entrance 113. The moveable plate 120 is disposed between the base 111 and the cover 112 in the Z-axis direction, and moves relative to the housing 110 along the moving direction (i.e., along the Y-axis direction) (as shown by the right arrows in FIG. 3). The moveable plate 120 has an opening OP. The diffuser 130 is disposed on the moveable plate 120 in the Z-axis direction, corresponding to the opening OP of the moveable plate 120, and disposed on the transmission path of the light beam L1 from the light entrance 113. The light sensor 140 is disposed on the base 111 in the Z-axis direction to sense the light beam L1 from the diffuser 130. In another embodiment, the opening OP of the moveable plate 120 may be changed to a light-transmitting plate made of a light-transmitting material, and the diffuser 130 is disposed on the light-transmitting plate.

For example, the base 111 and the cover 112 are connected by, for example, welding, gluing, screwing, or buckling, but the connection method of the base 111 and the cover 112 is not limited thereto. The diffuser 130 is, for example, made of a plastic material, in which the plastic material is, for example, polycarbonate (PC), polymethyl methacrylate (PMMA), or acrylonitrile butadiene styrene (ABS) resin. The diffuser 130 is attached on the moveable plate 120 by, for example, gluing. In one embodiment, as shown in FIG. 2, the light sensor 140 is disposed on the base 111 through, for example, screwing with screws 141. In other embodiments, the light sensor 140 is disposed on the base 111 by, for example, welding, gluing, or buckling.

Furthermore, referring to FIG. 3, in this embodiment, the diffuser 130 has at least two regions 131 arranged in the moving direction (i.e., the Y-axis direction). The at least two regions 131 respectively have different optical properties, and the light beam L1 has different brightness after respectively passing through the at least two regions 131. That is to say, after the light beam L1 passes through the light entrance 113 of the cover 112 and sequentially passes through different regions 131 of the diffuser 130 and the opening OP of the moveable plate 120, the light beam L1 transmitted to the light sensor 140 has different brightness, so that the brightness of the light beam L1 transmitted to the light sensor 140 may be adjusted by a single diffuser 130.

As mentioned above, by disposing the diffuser 130 on a moveable plate 120 that moves relative to the housing 110 and the light sensor 140 along a moving direction (i.e., along the Y-axis direction), such that the diffuser 130 arranged on the moving direction (i.e., the Y-axis direction) has at least two regions 131 with different optical properties, the region 131 where the light beam L1 passes through the diffuser 130 may be controlled by the movement of the moveable plate 120. Therefore, the brightness of the light beam L1 transmitted to the light sensor 140 may be effectively adjusted, such that the light adjustment module 100 has good adjustment ability.

Thereby, compared with the current light adjustment module, the structural design of the light adjustment module 100 of the embodiment may avoid the increase of maintenance hours due to the over exposure or insufficient brightness of the light beam L1 sensed by the light sensor 140, and may avoid the situation of using multiple diffusers, thereby reducing the number of parts, in turn reducing the cost of parts and assembly hours, and ultimately achieving the advantages of improving assembly efficiency and reducing assembly costs.

The light adjustment module 100 is further described below.

Referring to FIG. 1 to FIG. 3, in this embodiment, the housing 110 has a housing opening 114 (FIG. 1), and the moveable plate 120 comprises a body portion 121 and an extension portion 122 connected to each other. The opening OP (FIG. 2 and FIG. 3) is located on the body portion 121, the body portion 121 and the extension portion 122 are L-shaped, and the extension portion 122 passes through the housing opening 114 and extends outside of the housing 110. In this way, the operator may drive the moveable plate 120 and the diffuser 130 disposed on the moveable plate 120 to move together by pushing the extension portion 122 (shown by the right arrows in FIG. 3), thereby having good operability.

Specifically, referring to FIG. 2 and FIG. 4, in this embodiment, the housing 110 further comprises four protrusions 115, and the moveable plate 120 has four slot holes 123. Each protrusion 115 is slidably installed in the corresponding slot hole 123, and the extending direction of each slot hole 123 is parallel to the moving direction (i.e., along the Y-axis direction), so that the moveable plate 120 moves relative to the housing 110 and the light sensor 140 along the moving direction (i.e., along the Y-axis direction).

In detail, referring to FIG. 4, in this embodiment, the length D1 of the opening OP in the moving direction (i.e., along the Y-axis direction) is greater than or equal to the distance that the moveable plate 120 moves relative to the housing 110 and the light sensor 140 (i.e., the length D2 of the slot hole 123), so as to avoid the situation that the light beam L1 is blocked by the moveable plate 120 due to improper operation during the moving process of the moveable plate 120.

More specifically, referring to FIG. 4, in this embodiment, the orthographic projection of the diffuser 130 on the moveable plate 120 completely covers the opening OP, so that the light beam L1 first passes through the diffuser 130, and then passes through the moveable plate 120 through the opening OP to be transmitted to the light sensor 140.

Furthermore, referring to FIG. 3, in this embodiment, the at least two regions 131 of the diffuser 130 have a stepped structure, and the stepped structure of each of the at least two regions 131 respectively has different thicknesses in the light incident direction (i.e., the Z-axis direction) of the light beam L1. On a reference plane parallel to the YZ plane, the side surface of the diffuser 130 has a stepped profile. In this embodiment, the diffuser 130 is embodied as having four regions 131, and along the moving direction (i.e., the Y-axis direction), the thickness of the regions 131 increases gradually. The moveable plate 120 may be adjusted so that the thinner region 131 of the four regions 131 corresponds to the light entrance 113 of the cover 112, so as to increase the brightness of the light beam L1 sensed by the light sensor 140. It is also possible to adjust the moveable plate 120 so that the thicker region 131 of the four regions 131 corresponds to the light entrance 113 of the cover 112, so that the light beam L1 is diffused by the thicker region 131 to reduce the brightness of the light beam L1 sensed by the light sensor 140. Therefore, the brightness of the light beam L1 transmitted to the light sensor 140 may be adjusted by using the single diffuser 130 through the structural design of disposing four regions 131 with different thicknesses. In other embodiments, the number of regions 131 of the diffuser 130 may be adjusted according to actual usage conditions, and the present disclosure does not specifically limit the number of regions 131.

Figure 5:
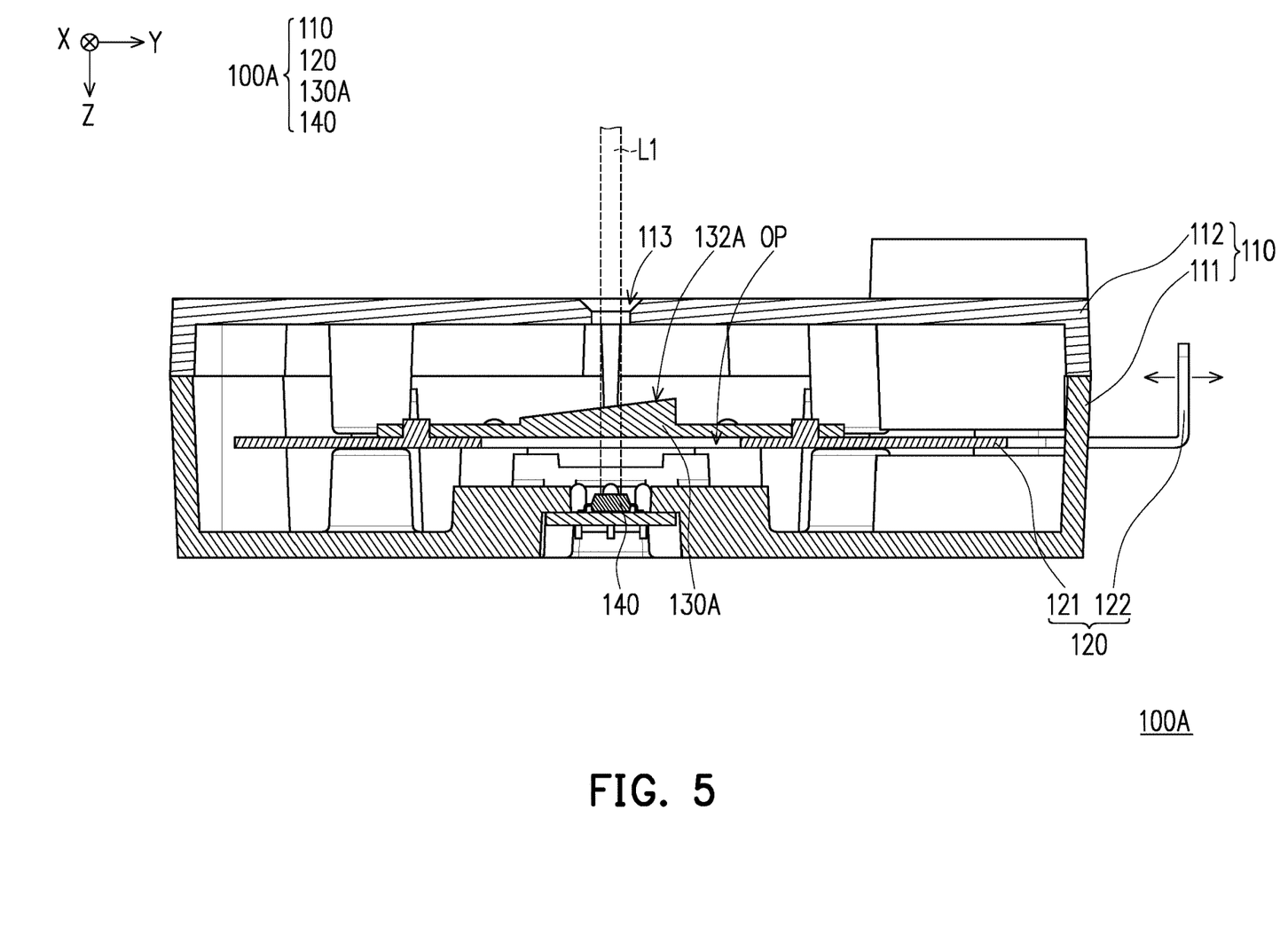
FIG. 5 is a cross-sectional schematic diagram of a light adjustment module according to another embodiment of the present disclosure.

Referring to FIG. 5, FIG. 5 is a cross-sectional schematic diagram of a light adjustment module according to another embodiment of the present disclosure. The structure and advantages of the light adjustment module 100A in FIG. 5 are similar to the light adjustment module 100 in FIG. 3, and only the differences are described below. In this embodiment, the multiple regions of the diffuser 130A have different thicknesses in the light incident direction (i.e., the Z-axis direction) of the light beam L1, and the side surface 132A of the diffuser 130A facing the light entrance 113 is an inclined surface. More specifically, on a reference plane parallel to the YZ plane, the surface of the diffuser 130A is trapezoidal or triangular. Along the moving direction (i.e., the Y-axis direction), the thickness of the region of the diffuser 130A gradually increases. The moveable plate 120 may be adjusted so that the thinner region of the multiple regions corresponds to the light entrance 113 of the cover 112, so as to increase the brightness of the light beam L1 sensed by the light sensor 140. It is also possible to adjust the moveable plate 120 so that the thicker region of the multiple regions corresponds to the light entrance 113 of the cover 112, so that the light beam L1 is diffused by the thicker region to reduce the brightness of the light beam L1 sensed by the light sensor 140. Therefore, the brightness of the light beam L1 transmitted to the light sensor 140 may be adjusted by using the single diffuser 130A through the structural design of disposing multiple regions with different thicknesses.

Figure 6:
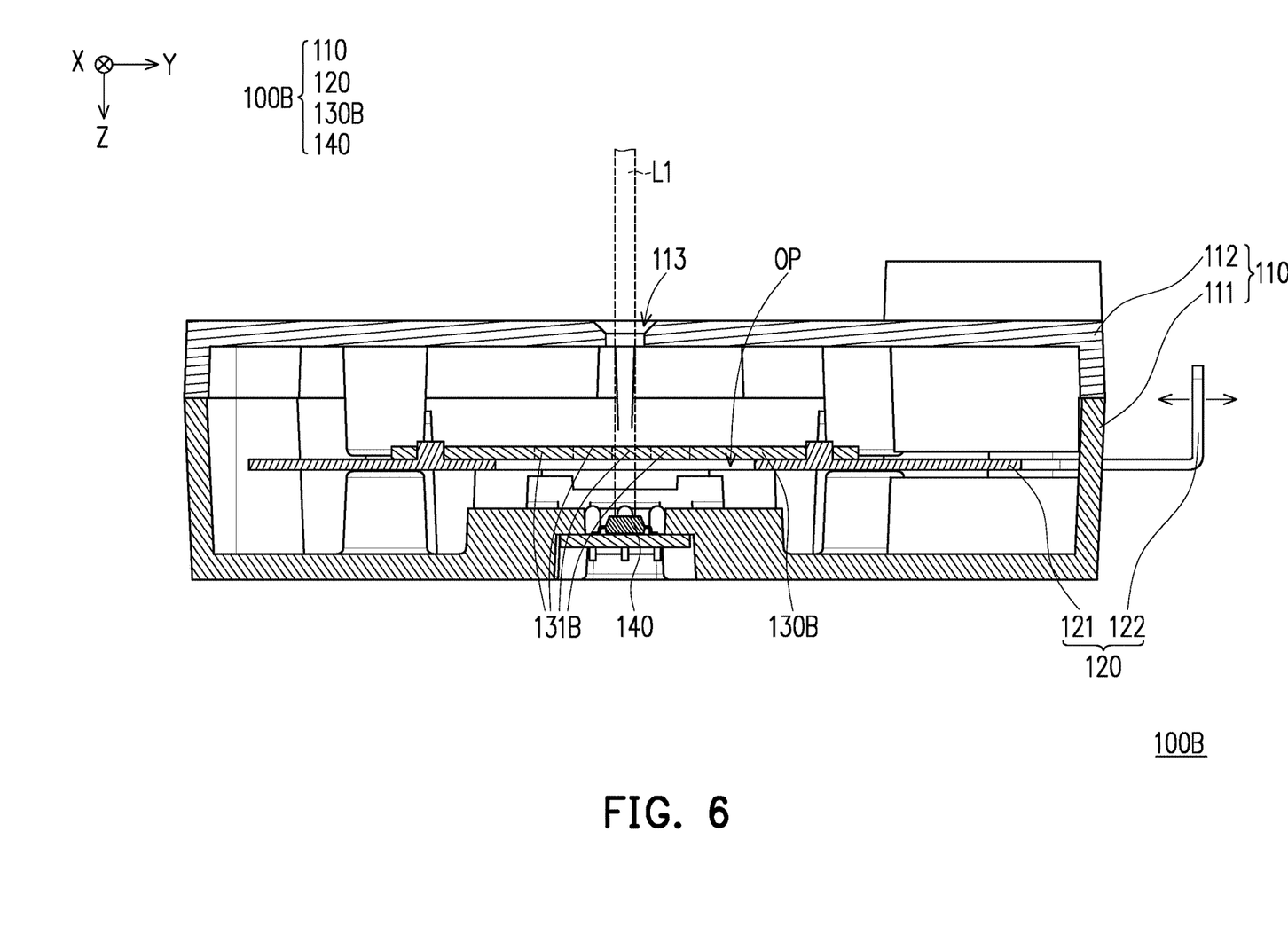
FIG. 6 is a cross-sectional schematic diagram of a light adjustment module according to another embodiment of the present disclosure.
Figure 7:
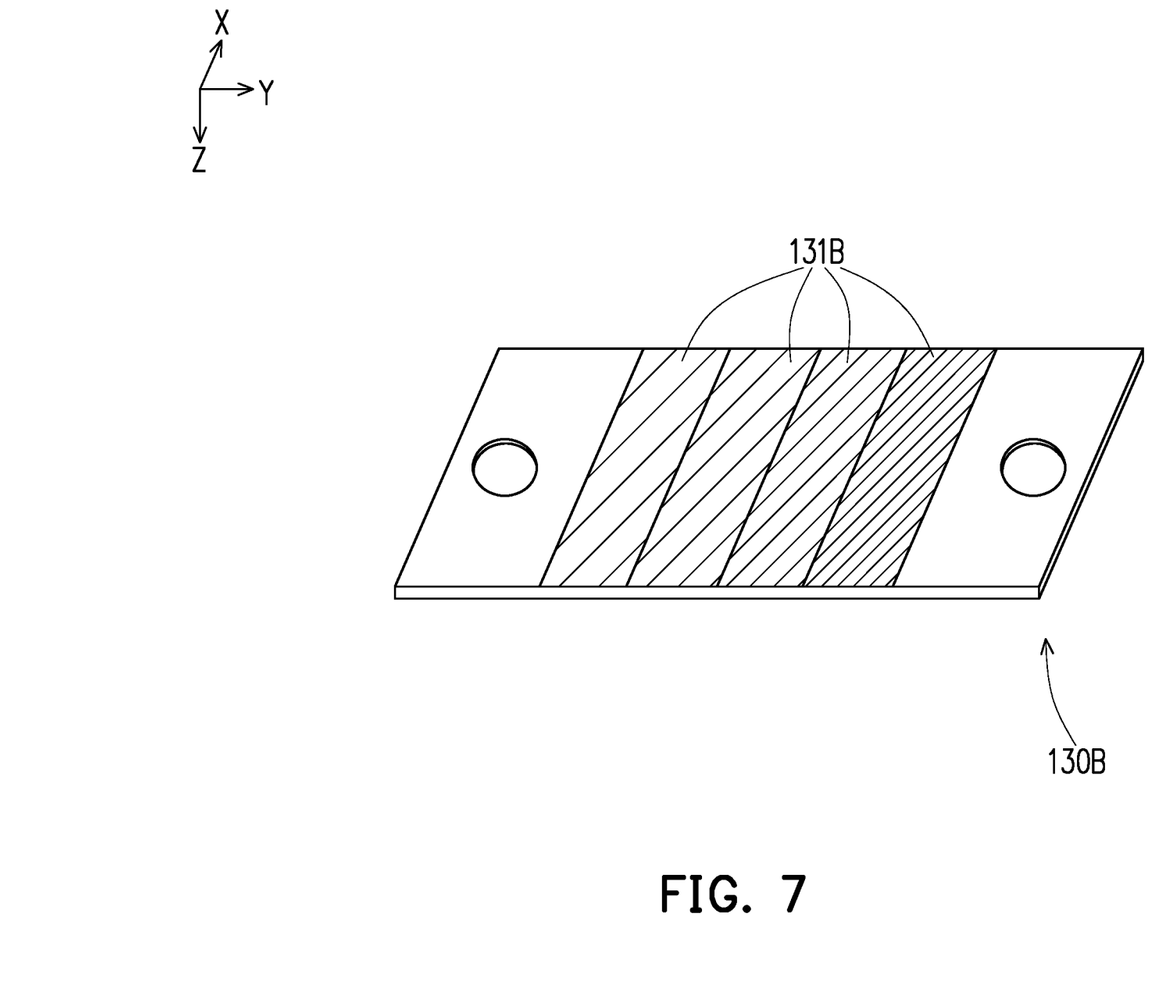
FIG. 7 is a three-dimensional schematic diagram of a diffuser of the light adjustment module in FIG. 6.

Referring to FIG. 6 and FIG. 7, FIG. 6 is a cross-sectional schematic diagram of a light adjustment module according to another embodiment of the present disclosure. FIG. 7 is a three-dimensional schematic diagram of a diffuser of the light adjustment module in FIG. 6. The structure and advantages of the light adjustment module 100B in FIG. 6 are similar to the light adjustment module 100 in FIG. 3, and only the differences are described below. In this embodiment, at least two regions 131B of the diffuser 130B respectively have different roughness, in which the regions 131B with different roughness have different degrees of light transmission. In this embodiment, the diffuser 130B is embodied as having four regions 131B, and along the moving direction (i.e., the Y-axis direction), the roughness of the regions 131B increases gradually. The moveable plate 120 may be adjusted so that the region 131B with the smaller roughness of the four regions 131B corresponds to the light entrance 113 of the cover 112, so as to increase the brightness of the light beam L1 sensed by the light sensor 140. It is also possible to adjust the moveable plate 120 so that the region 131B with the larger roughness of the four regions 131B corresponds to the light entrance 113 of the cover 112, so that the light beam L1 is diffused by the region 131B with the larger roughness to reduce the brightness of the light beam L1 sensed by the light sensor 140. Therefore, the brightness of the light beam L1 transmitted to the light sensor 140 may be adjusted by using the single diffuser 130B through the structural design of disposing four regions 131B with different roughness. For example, the four regions 131B are respectively provided with matte textures on the surface to achieve different degrees of roughening effects.

In summary, the embodiments of the present disclosure have at least one of the following advantages or effects. In the light adjustment module of the present disclosure, by disposing the diffuser on a moveable plate that moves relative to the housing and the light sensor along a moving direction, in which the diffuser arranged on the moving direction has at least two regions with different optical properties, the region where the light beam passes through the diffuser may be controlled by the movement of the moveable plate. Therefore, the brightness of the light beam transmitted to the light sensor may be effectively adjusted, such that the light adjustment module has good adjustment ability.

Thereby, compared with the current light adjustment module, the structural design of the light adjustment module of the present disclosure may avoid the increase of maintenance hours due to the over exposure or insufficient brightness of the light beam sensed by the light sensor, and may avoid the situation of using multiple diffusers, thereby reducing the number of parts, in turn reducing the cost of parts and assembly hours, and ultimately achieving the advantages of improving assembly efficiency and reducing assembly costs.

The foregoing description of the preferred embodiments of the disclosure has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the disclosure and its best mode practical application, thereby to enable persons skilled in the art to understand the disclosure for various embodiments and with various modifications as are suited to the particular use or implementation contemplated. It is intended that the scope of the disclosure be defined by the claims appended hereto and their equivalents in which all terms are meant in their broadest reasonable sense unless otherwise indicated. Therefore, the term "the disclosure", "the present disclosure" or the like does not necessarily limit the claim scope to a specific embodiment, and the reference to particularly preferred exemplary embodiments of the disclosure does not imply a limitation on the disclosure, and no such limitation is to be inferred. The disclosure is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the disclosure. It should be appreciated that variations may be made in the embodiments described by persons skilled in the art without departing from the scope of the present disclosure as defined by the following claims. Moreover, no element and component in the present disclosure is intended to be dedicated to the public regardless of whether the element or component is explicitly recited in the following claims.

What is claimed is:

1. A light adjustment module, suitable for being disposed on a transmission path of a light beam, and comprising:
    a housing, comprising a base and a cover connected to each other, and the cover having a light entrance;
    a moveable plate, disposed between the base and the cover, and the movable plate being configured to move relative to the housing along a moving direction;
    a single diffuser, disposed on the moveable plate and configured to move with the movable plate along the moving direction, and the single diffuser being disposed on the transmission path of the light beam from the light entrance; and
    a light sensor, disposed on the base to sense the light beam from the single diffuser;
    wherein
    the single diffuser has at least two regions arranged along the moving direction,
    and when the at least two regions of the single diffuser are respectively moved to the transmission path of the light beam, the light beam passing through the single diffuser has different brightness; and
    wherein the at least two regions respectively have different thicknesses in a light incident direction, the thicknesses of the at least two regions gradually change along the moving direction, and the light incident direction is perpendicular to the moving direction; or/and
    wherein the at least two regions respectively have different roughnesses, and roughnesses of the at least two regions gradually change along the moving direction.

2. The light adjustment module according to claim 1, wherein the at least two regions of the single diffuser have a stepped structure.

3. The light adjustment module according to claim 1, wherein a side surface of the single diffuser facing the light entrance is an inclined surface.

4. The light adjustment module according to claim 1, wherein the housing has a housing opening, the moveable plate comprises an extension portion, and the extension portion passes through the housing opening and extends outside of the housing.

5. The light adjustment module according to claim 4, wherein the moveable plate comprises a body portion connected with the extension portion, the body portion has an opening, and the body portion and the extension portion are L-shaped.

6. The light adjustment module according to claim 1, wherein the housing comprises at least one protrusion, the moveable plate has at least one slot hole, the at least one protrusion is slidably disposed in the at least one slot hole, and an extending direction of the at least one slot hole is parallel to the moving direction.

7. The light adjustment module according to claim 1, wherein the moveable plate has an opening, an orthographic projection of the single diffuser on the moveable plate completely covers the opening.

8. The light adjustment module according to claim 1, wherein the moveable plate has an opening, a length of the opening in the moving direction is greater than or equal to a distance that the moveable plate moves relative to the housing and the light sensor in the moving direction.

* * * * *